(12) United States Patent
Utsumi et al.

(10) Patent No.: US 9,923,062 B2
(45) Date of Patent: Mar. 20, 2018

(54) SILICON CARBIDE SEMICONDUCTOR DEVICE AND METHOD OF MANUFACTURING A SILICON CARBIDE SEMICONDUCTOR DEVICE

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Makoto Utsumi, Tsukuba (JP); Yoshiyuki Sakai, Tsukuba (JP); Kenji Fukuda, Tsukuba (JP); Shinsuke Harada, Tsukuba (JP); Mitsuo Okamoto, Tsukuba (JP)

(73) Assignees: FUJI ELECTRIC CO., LTD., Kawasaki-Shi, Kanagawa (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 5 days.

(21) Appl. No.: 15/058,139

(22) Filed: Mar. 1, 2016

(65) Prior Publication Data
US 2016/0181376 A1    Jun. 23, 2016

Related U.S. Application Data

(63) Continuation of application No. PCT/JP2014/071122, filed on Aug. 8, 2014.

(30) Foreign Application Priority Data

Sep. 5, 2013  (JP) .................................. 2013-184515

(51) Int. Cl.
*H01L 29/16* (2006.01)
*H01L 29/66* (2006.01)
(Continued)

(52) U.S. Cl.
CPC ...... *H01L 29/1608* (2013.01); *H01L 21/0485* (2013.01); *H01L 21/283* (2013.01);
(Continued)

(58) Field of Classification Search
CPC ............ H01L 21/0485; H01L 29/1608; H01L 21/324; H01L 29/45; H01L 21/27115
See application file for complete search history.

(56) References Cited

U.S. PATENT DOCUMENTS 5,580,388 A  *  12/1996  Moore ................ C23C 16/4404
                                                118/500
2003/0168663 A1    9/2003  Slater et al.
(Continued)

FOREIGN PATENT DOCUMENTS

DE           10051049 A1     4/2002
JP         2003-086534 A     3/2003
(Continued)

OTHER PUBLICATIONS

Ito et al., "Simultaneous Formation of Ni/Al Ohmic Contacts in Both n- and p-Type 4H SiC," Journal of Electronic Materials, vol. 37, No. 11, 2006.*
Ito et al., "Simultaneous Formation of Ni/Al Ohmic Contacts to Both n- and p-Type 4H-SiC", Journal of Electronic Materials, vol. 37, No. 11, Aug. 8, 2008, p. 1674-1680.
R. Ashokan et al., "IR Absorption Spectra of SiO2 Films Grown by Photo-CVD", Solid State Physics Laboratory, Ministry of Defense, Jan. 1, 1990.
(Continued)

*Primary Examiner* — Tom Thomas
*Assistant Examiner* — John Bodnar
(74) *Attorney, Agent, or Firm* — Rabin & Berdo, P.C.

(57) ABSTRACT

An infrared ray absorbing film is selectively formed on a surface of a silicon carbide semiconductor substrate in a predetermined area. The infrared ray absorbing film is composed of one of a multi-layered film of titanium nitride
(Continued)

and titanium, a multi-layered film of molybdenum nitride and molybdenum, a multi-layered film of tungsten nitride and tungsten, or a multi-layered film of chromium nitride and chromium. An aluminum film and a nickel film are sequentially formed in this order on the silicon carbide semiconductor substrate in an area excluding the predetermined area in which the infrared ray absorbing film is formed. The silicon carbide semiconductor substrate is thereafter heated using a rapid annealing process with a predetermined heating rate to form an electrode. The rapid annealing process converts the nickel film into a silicide and, with the aluminum film, provides an electrode having ohmic contact.

13 Claims, 7 Drawing Sheets

(51) Int. Cl.
    *H01L 21/04*     (2006.01)
    *H01L 21/283*     (2006.01)
    *H01L 21/324*     (2006.01)
    *H01L 29/45*     (2006.01)
    *H01L 29/78*     (2006.01)

(52) U.S. Cl.
    CPC ............ *H01L 21/324* (2013.01); *H01L 29/45* (2013.01); *H01L 29/66068* (2013.01); *H01L 29/66477* (2013.01); *H01L 29/7802* (2013.01)

(56) References Cited

U.S. PATENT DOCUMENTS

| | | | |
|---|---|---|---|
| 2007/0102638 A1 | 5/2007 | Watanabe | |
| 2010/0044705 A1* | 2/2010 | Langer | ................ H01L 29/36 257/51 |
| 2011/0233560 A1 | 9/2011 | Koike et al. | |
| 2013/0062624 A1* | 3/2013 | Tsuchiya | ............ H01L 29/0839 257/77 |

FOREIGN PATENT DOCUMENTS

| | | |
|---|---|---|
| JP | 2003-229565 A | 8/2003 |
| JP | 2007-059646 A | 3/2007 |
| JP | 2007-101213 A | 4/2007 |
| JP | 2007-149984 A | 6/2007 |
| JP | 2008-204972 A | 9/2008 |
| JP | 2011-222607 A | 11/2011 |
| JP | 2013-016707 A | 1/2013 |
| WO | WO-2011/115294 A1 | 9/2011 |

OTHER PUBLICATIONS

B.C. Henry et al., "Semiconductor Structure with Integrated Infrared Energy Absorption Layer", IBM Technical Disclosure Bulletin, vol. 22, No. 2, Jul. 1979.

David D. Allred et al., "Spectrally Selective Surfaces by Chemical Vapor Deposition", Solar Energy Materials, vol. 12, No. 12, May 1, 1985.

* cited by examiner

| INFRARED RAY ABSORBING FILM | AVERAGE CONTACT RESISTIVITY ($1 \times 10^{-2} \Omega cm^2$) | CONTACT RESISTIVITY DISTRIBUTION (%) |
|---|---|---|
| TITANIUM NITRIDE | 0.04 | 6 |
| MOLYBDENUM NITRIDE | 0.04 | 6 |
| TUNGSTEN NITRIDE | 0.04 | 6 |
| CHROMIUM NITRIDE | 0.04 | 6 |
| CARBON | 0.02 | 4 |
| NONE | 1.5 | 12 |

FIG.6

| INFRARED RAY ABSORBING FILM | AVERAGE CONTACT RESISTIVITY ($1 \times 10^{-2} \Omega cm^2$) | CONTACT RESISTIVITY DISTRIBUTION (%) |
|---|---|---|
| FIG. 2 | 0.04 | 6 |
| FIG. 3 | 0.03 | 4 |
| FIG. 4 | 0.03 | 3 |
| NONE | 1.5 | 12 |

FIG.9

| HEATING RATE (°C/sec) | Ni SILICIDE FORMATION | NiAl ALLOY FORMATION |
|---|---|---|
| 0.5 | NO | YES |
| 1.0 | YES | YES |
| 4.0 | YES | NO |
| 10 | YES | NO |

SILICON CARBIDE SEMICONDUCTOR DEVICE AND METHOD OF MANUFACTURING A SILICON CARBIDE SEMICONDUCTOR DEVICE

CROSS REFERENCE TO RELATED APPLICATIONS

This is a continuation application of International Application PCT/JP2014/071122 filed on Aug. 8, 2014 which claims priority from a Japanese Patent Application No. 2013-184515 filed on Sep. 5, 2013, the contents of which are incorporated herein by reference.

BACKGROUND OF THE INVENTION

1. Field of the Invention

The present invention relates to a silicon carbide (SiC) semiconductor device and a method of manufacturing a silicon carbide semiconductor device.

2. Description of the Related Art

A silicon carbide semiconductor has a wider band gap compared to that of a silicon (Si) semiconductor and has therefore high breakdown electric field strength. "On-resistivity", which is resistivity in the conduction state, is inversely proportional to the cube of the breakdown electric field strength and therefore, in silicon carbide semiconductors (a four-layer-cycle hexagonal crystal: 4H—SiC) that are widely used and called 4-H types, the on-resistivity can be suppressed to be several-hundredths of that of a silicon semiconductor.

With its property of high thermal conductivity that facilitates heat dissipation in addition to the above, the silicon carbide semiconductor is therefore expected to become a next-generation low-loss power semiconductor device. Silicon carbide semiconductor devices having various structures have been developed using the silicon carbide semiconductor such as, for example, a Schottky barrier diode, a MOSFET (an insulated gate field-effect transistor), a PN diode, an IGBT (an insulated gate bipolar transistor), and a GTO (a gate turnoff thyristor).

On the other hand, concerning an ohmic electrode important in fabricating a silicon carbide semiconductor device, although it is clear that for an n-type region, excellent ohmic contact can be formed by using nickel (Ni) as the material of the ohmic electrode, for a p-type region, the material and a structure to form the ohmic contact are still under study. A multi-layered film of aluminum (Al) and Ni has been proposed as an example of an ohmic electrode in the p-type region (see, Ito, Kazuhiro, et al, "Simultaneous Formation of Ni/Al Ohmic Contacts to Both n- and p-Type 4H—SiC", Journal of ELECTRONIC MATERIALS, Vol. 37, No. 11, 2008, pp. 1674-1680).

An ohmic electrode is generally formed by forming a metal film on a silicon carbide semiconductor layer and thereafter, performing annealing under reduced pressure or in an inert gas atmosphere to produce a metal silicide. When a silicon carbide semiconductor device is produced, the annealing is generally performed at about 1000 degrees C. However, when annealing is performed for a multi-layered film of different metals such as the above film of Ni and Al, an alloy is produced between the metals without the formation of metal silicide between the silicon carbide semiconductor layer and the metal. A problem therefore arises in that this does not function as an ohmic electrode.

A rapid annealing (RTA: Rapid Thermal Annealing) method is a method of efficiently producing a metal silicide. The RTA method is based on a mechanism that uses an infrared ray lamp to heat the substrate by a high heating rate, where the object to be heated is generally placed on a carbon susceptor because this annealing also efficiently heats materials having low infrared ray emissivity such as, for example, metal and synthetic quartz materials.

When this mechanism is applied to the formation of a silicon carbide semiconductor device, a majority of the infrared rays from a halogen lamp used as the infrared ray lamp are absorbed by the carbon susceptor and not by the silicon carbide substrate because the silicon carbide semiconductor substrate does not absorb near-infrared rays of wavelengths up to about 2.5 μm. The silicon carbide substrate is heated by thermal conduction due to the contact with the susceptor. Temperature distributions occur on the front face of the silicon carbide substrate and at portions not in contact with the susceptor depending on the shape of the substrate and are the reason no metal silicide is formed.

This uneven formation of the metal silicide causes variance in the contact resistivity and variance in the properties and the reliability of the device.

SUMMARY OF THE INVENTION

According to one aspect of the present invention, a method of manufacturing a silicon carbide semiconductor device includes selectively forming an infrared ray absorbing film on a surface of a silicon carbide semiconductor substrate; sequentially forming on the silicon carbide semiconductor substrate, an aluminum film and a nickel film in an area excluding an area in which the infrared ray absorbing film is formed; and uniformly forming an electrode by a rapid annealing process with a predetermined heating rate on the silicon carbide semiconductor substrate.

At the rapid annealing process, the silicon carbide semiconductor substrate is placed on a carbon susceptor and heating is performed at an increasing temperature of at least 1 degree C. per second with respect to a temperature measurement of the carbon susceptor.

The method further includes roughening a surface of the infrared ray absorbing film.

According to a further aspect of the present invention, a silicon carbide semiconductor device includes an infrared ray absorbing film selectively formed on a surface of a silicon carbide semiconductor substrate; an aluminum film and a nickel film sequentially formed on the silicon carbide semiconductor substrate, in an area excluding an area in which the infrared ray absorbing film is formed; and an electrode uniformly formed on the silicon carbide semiconductor substrate, by a rapid annealing process with a predetermined heating rate.

In the silicon carbide semiconductor device, the infrared ray absorbing film is formed by at least one of titanium nitride, molybdenum nitride, tungsten nitride, chromium nitride, and a multi-layered film thereof.

In the silicon carbide semiconductor device, the infrared ray absorbing film is formed by any one of a multi-layered film of titanium nitride and titanium, a multi-layered film of molybdenum nitride and molybdenum, a multi-layered film of tungsten nitride and tungsten, and a multi-layered film of chromium nitride and chromium.

In the silicon carbide semiconductor device, the infrared ray absorbing film is formed having a thickness of at least 10 nm and no more than 300 nm.

In the silicon carbide semiconductor device, the aluminum film is formed having a thickness of at least 10 nm and no more than 100 nm.

In the silicon carbide semiconductor device, the nickel film is formed having a thickness of at least 20 nm and no more than 100 nm.

In the silicon carbide semiconductor device, the infrared ray absorbing film is formed in an active region excluding a source contact electrode portion of a chip area.

In the silicon carbide semiconductor device, the infrared ray absorbing film is formed in a chip area overall.

In the silicon carbide semiconductor device, the infrared ray absorbing film is formed in an area excluding a chip area of a wafer.

In the silicon carbide semiconductor device, the infrared ray absorbing film is formed in an area excluding an opening exposing an n-type region and a p-type region, among openings of an interlayer insulating film.

In the silicon carbide semiconductor device, the nickel film is formed on the n-type region, and the aluminum film and the nickel film are stacked on the p-type region.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 6 is a comparison diagram of contact resistivity between a case where the infrared ray absorbing film is disposed according to a second embodiment of the present invention and a case where the infrared ray absorbing film is not disposed;

FIG. 9 is a table indicating presence/absence of Ni silicide formation according to heating rate, according to the fourth embodiment of the present invention.

DETAILED DESCRIPTION OF THE INVENTION

Figure 1:
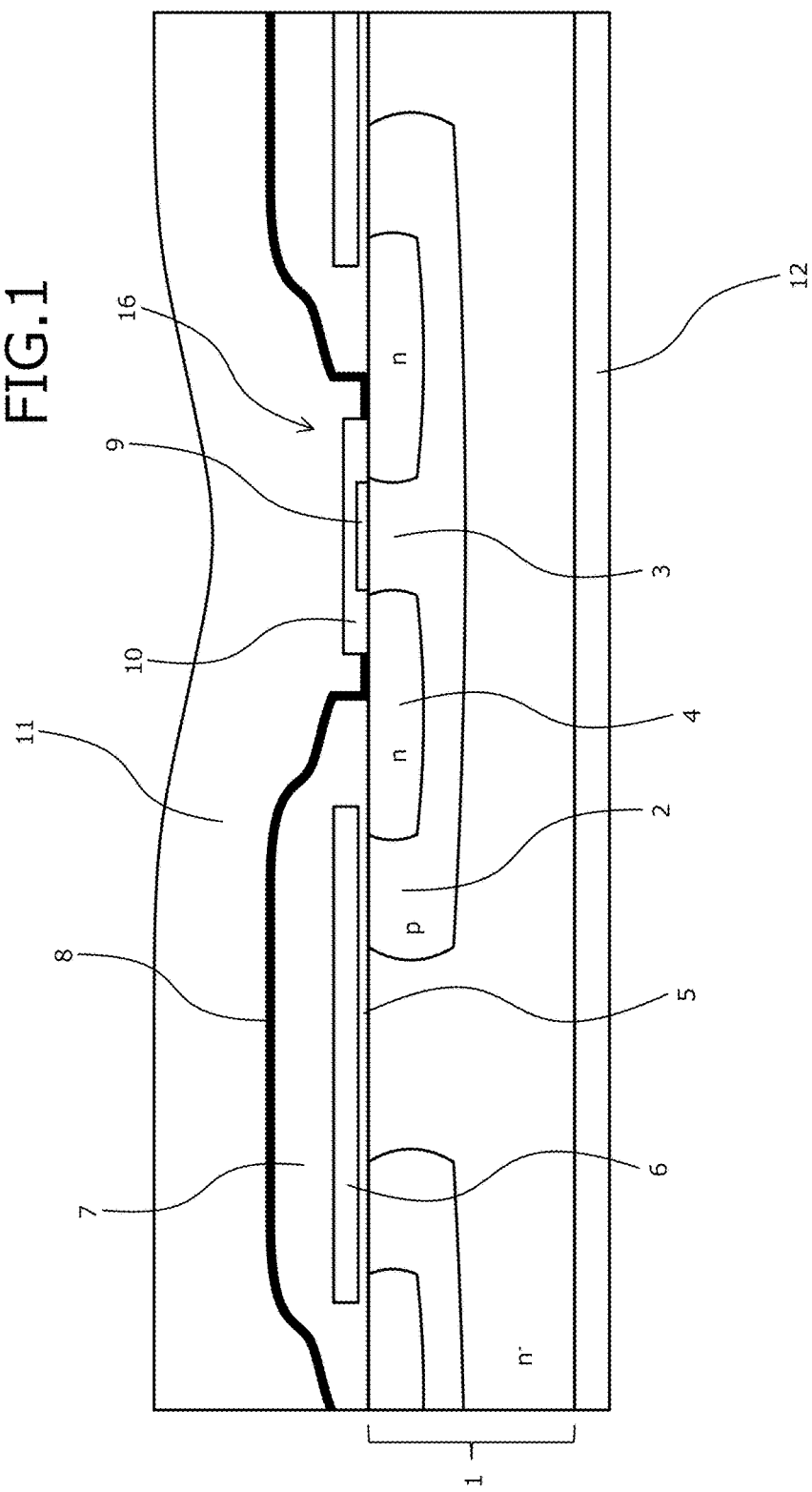
FIG. 1 is a cross-sectional view of a silicon carbide semiconductor device having an infrared ray absorbing film disposed therein according to a first embodiment of the present invention.

Preferred embodiments of the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not repeatedly be described.

(First Embodiment)

Figure 2:
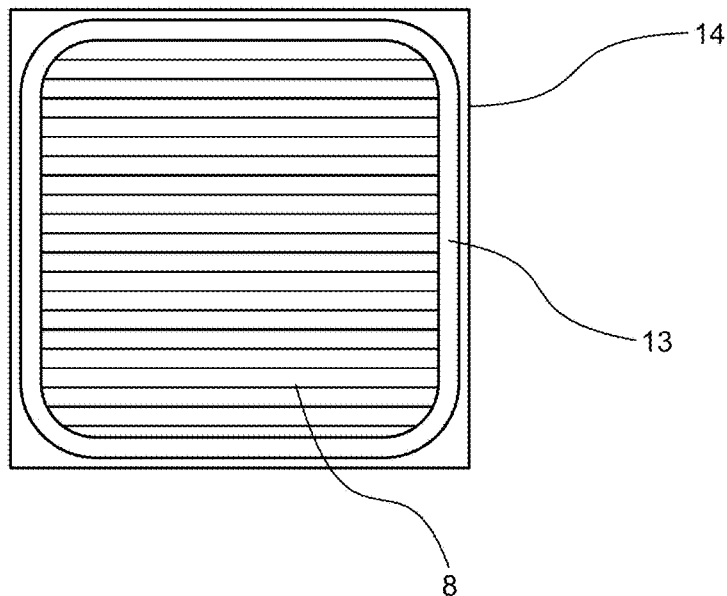
FIG. 2 is a plan view (part 1) of a position of the infrared ray absorbing film according to the first embodiment of the present invention.
Figure 3:
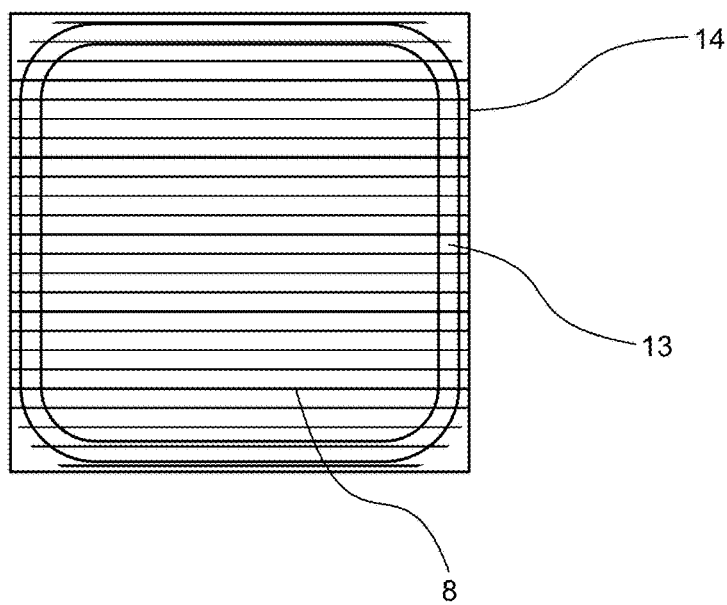
FIG. 3 is a plan view (part 2) of a position of the infrared ray absorbing film according to the first embodiment of the present invention.
Figures 4, 5:
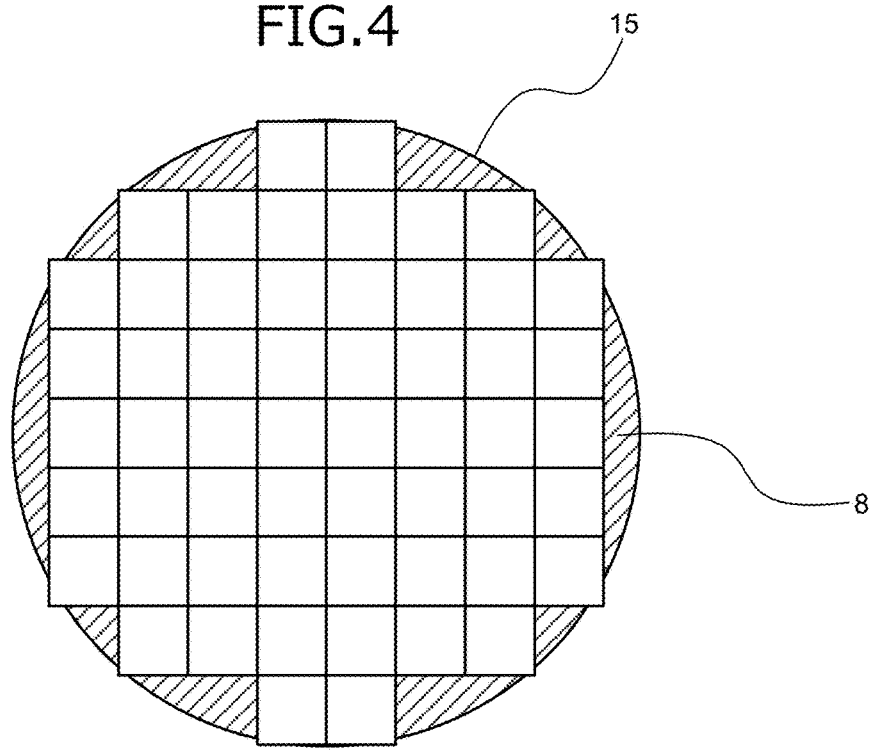
FIG. 4 is a plan view (part 3) of a position of the infrared ray absorbing film according to the first embodiment of the present invention.
FIG. 5 is a comparison diagram of a case where the infrared ray absorbing film is disposed according to the first embodiment of the present invention and a case where no such infrared ray absorbing film is disposed.

A method of manufacturing a silicon carbide semiconductor device according to a first embodiment of the present invention will be described taking an example of a case where a double implantation MOSFET (a DIMOSFET) is manufactured (produced) using a double implantation (Double Implant) process to form a p-type well region and an n-type source region by ion implantation. FIG. 1 is a cross-sectional view of the silicon carbide semiconductor device having an infrared ray absorbing film disposed therein according to the first embodiment of the present invention. FIGS. 2 to 4 are plan views of a position of the infrared ray absorbing film according to the first embodiment of the present invention.

For example, an $n^-$-type silicon carbide single crystal semiconductor substrate (hereinafter, referred to as "$n^-$-type silicon carbide substrate") 1 is first prepared, that is formed from a silicon carbide four-layer-cycle hexagonal crystal (4H—SiC) and has an $n^-$-type silicon carbide epitaxial layer deposited on one principal surface.

A p-type well region 2, and a p-type contact region 3 and an n-type source region 4 inside the p-type well region 2 are formed in the $n^-$-type silicon carbide substrate (a surface layer of the $n^-$-type silicon carbide epitaxial layer) 1 by ion implantation. When the p-type well region 2, the p-type contact region 3, and the n-type source region 4 are formed, the $n^-$-type silicon carbide substrate 1 having formed thereon an ion implantation mask of a silicon oxide film and the like that includes openings corresponding to the regions is introduced into an ion implanting apparatus to perform the above ion implantation. An n-type region is formed by implanting phosphorus ions or nitrogen ions. A p-type region is formed by implanting aluminum ions and the like. The n-type or the p-type regions are thereby formed in the openings of the ion implantation mask in the $n^-$-type silicon carbide substrate 1. By repeating this, the p-type well region 2, the p-type contact region 3, and the n-type source region 4 are formed.

A p-type breakdown voltage ring portion 13 is formed to surround an active region that has p-type well regions concentrated therein (see FIG. 2). An area up to the region that has the p-type breakdown voltage ring portion 13 disposed therein constitutes an area of one silicon carbide semiconductor device (a MOSFET device), and plural devices are arranged on the single $n^-$-type silicon carbide substrate 1.

After removing the ion implantation mask, activation annealing is performed at a temperature of about 1700 degrees C. in an inert atmosphere such as argon. A gate insulating film 5 is grown on a surface of the $n^-$-type silicon carbide substrate 1 by thermal oxidation, and a polysilicon film is formed thereon using a chemical vapor deposition (CVD) method. A gate electrode 6 is formed in an area extending over adjacent p-type well regions 2, using a photolithography process. A patterned silicon oxide film may be formed in advance on portions in which the gate insulating film 5 is unnecessary such as on the p-type breakdown voltage ring portion 13.

An interlayer insulating film 7 formed of a silicon oxide film is formed using the CVD method, and openings are disposed in the interlayer insulating film 7 on the n-type source region 4 and the p-type contact region 3 using a photolithography process. The openings of the interlayer insulating film 7 are also disposed on junction regions (not depicted) between the gate electrode 6 and an outlet electrode 11 of the gate electrode 6.

An infrared ray absorbing film 8 is disposed on the interlayer insulating film 7. Preferably, a material having infrared ray emissivity of 0.5 or higher for near infrared rays having wavelengths of about 0.8 μm to about 2.5 μm is used as a material used for the infrared ray absorbing film 8. For example, titanium nitride, molybdenum nitride, tungsten nitride, and chromium nitride can be used.

A structure in which a metal material and metal nitride are stacked on each other may be used to maintain the adhesiveness between the infrared ray absorbing film 8 and the interlayer insulating film 7 and to suppress generation of cracks in the infrared ray absorbing film. For example, titanium is deposited on the interlayer insulating film 7 using Ar as a sputtering gas and thereafter, the sputtering gas is changed to a mixture gas of nitrogen and Ar and sputtering is performed to thereby deposit titanium nitride.

Preferably, the thickness of the infrared ray absorbing film 8 is a film thickness that enables the infrared ray absorbing film 8 to absorb the infrared rays, inhibits deformation such as cracking consequent heating, and is, preferably, about 10 nm to about 300 nm. For example, when titanium nitride is used as the infrared ray absorbing film 8, the film can be deposited using a reactive sputtering method that uses a titanium (Ti) target and a mixture gas of argon (Ar) and nitrogen, a sputtering method that uses a titanium nitride target, a CVD method that uses titanium tetra chloride and an ammonia gas, and the like.

The infrared ray absorbing film 8 is patterned to be formed in all or a portion of an area excluding a source contact electrode portion (an opening to expose the n-type source region 4 and the p-type contact region 3 inside an opening of the interlayer insulating film 7) 16, a gate contact electrode portion (an opening (not depicted) to dispose the junction region between the gate electrode 6 and the outlet electrode 11 of the gate electrode 6 in the opening of the interlayer insulating film 7), and a gap portion to maintain insulation between these electrodes. The junction region between the gate electrode 6 and the outlet electrode 11 of the gate electrode 6 is formed near an interface of the active region and the p-type breakdown voltage ring portion 13.

As depicted in FIG. 2, in a chip region 14, the infrared ray absorbing film 8 is disposed in an active region excluding the source contact electrode portion 16 (see FIG. 1) (an active region inside the p-type breakdown voltage ring portion 13). As depicted in FIG. 3, the infrared ray absorbing film 8 may be disposed on the chip region 14 overall excluding the source contact electrode portion 16. In addition, as depicted in FIG. 4, the n⁻-type silicon carbide substrate 1 can also be heated evenly by using the infrared ray absorbing film 8 for the portions that cannot be used as the device (the chip region 14) such as the outer peripheral portions of a wafer 15 (shaded portions in FIG. 4).

The patterning for the infrared ray absorbing film 8 can be performed by a photolithography process using wet etching or dry etching. For example, a metal nitride film can be processed with high dimensional precision by dry etching using chlorine gas, four hydrogen fluoride (4HF), and the like.

The infrared ray emissivity can be improved by roughening the surface (the front face) of the infrared ray absorbing film 8. For example, the surface of the infrared ray absorbing film 8 can be made uneven by patterning the infrared ray absorbing film 8, removing thereafter the resist mask used in the patterning of the infrared ray absorbing film 8, and inserting again the wafer 15 into the dry etching apparatus to etch the wafer 15 for a short time.

The surface of the infrared ray absorbing film 8 can be made uneven by roughening in advance the surface of the interlayer insulating film 7 disposed beneath the infrared ray absorbing film 8. In this case, the surface can be made uneven by patterning the interlayer insulating film 7, removing thereafter the resist mask used in the patterning of the interlayer insulating film 7, and inserting again the wafer 15 into the dry etching apparatus to etch the wafer 15 for a short time.

Here, description with reference to FIG. 1 is continued. The p-type contact film is formed using a sputtering method and the like, and a p-type contact pattern 9 is disposed on the p-type contact region 3 using photolithography. Although any Group 3B element such as boron (B) or indium (In) is can be used as a material of the p-type contact, preferably, Al is used because of ease of Al pattern formation. For example, in a case where Al is used and the thickness thereof is 5 nm or greater, lower contact resistivity with the p-type region is achieved compared to a case where only a Ni film is used, and when the thickness is 10 nm or greater, the dimensions of the Al pattern are more stable and the evenness of the contact resistivity in the wafer face is improved. When the thickness of the Al film exceeds 100 nm, alloying with the Ni film mainly occurs, obstructing the formation of the silicide.

An Ni film of 50 nm is deposited using a sputtering method and the like, and a Ni pattern 10 is formed using photolithography in an area covering the n-type source region 4 and the p-type contact region 3. Preferably, the thickness of the Ni film is a thickness that enables the silicide to be formed with high efficiency and that provides excellent control of the dimensions by the patterning; a thickness of about 20 to about 100 nm is used.

The wafer 15 is heated at about 1000 degrees C. in an inert gas atmosphere or in a reduced-pressure atmosphere using an RTA method and Ni silicide of the Ni pattern 10 is thereby produced on the p-type contact region 3 and the n-type source region 4 to form the source contact electrode portion 16. Preferably, the heating rate is 1 degree C. per minute or higher. When the heating rate is lower than 1 degree C. per minute, the alloying of the Al film and the Ni film preferentially occurs, obstructing the formation of the silicide. Rates of temperature increases exceeding 25 degrees C. per second are difficult to realize because the sample is affected by thermal shock, cracking occurs, and the like.

The outlet electrode 11 of Al having a thickness of 5 μm is formed by patterning to cover the source contact electrode portion 16. The outlet electrode 11 is also disposed on the gate electrode 6 away from the source region and, the gate and the outlet electrodes 11 are driven independently. A multi-layered film of Ti and Ni is disposed on the back face of the n⁻-type silicon carbide substrate 1 to be used as a drain electrode (a back face electrode) 12 and the silicon carbide semiconductor device (the MOSFET device) is thereby fabricated.

EXAMPLE

A double implantation MOSFET was fabricated according to the method of manufacturing a silicon carbide semiconductor device of the first embodiment. For example, an n⁻-silicon carbide substrate 1 was prepared having an epitaxially grown high resistivity layer of an n-type doping concentration of $2 \times 10^{15}$ cm⁻³ and a thickness of 15 μm. An ion implantation mask made from a silicon oxide film having a thickness of 1.5 µm was formed and the p-type well region 2 was formed by implanting Al ions at a temperature of 500 degrees C. The doping concentration was set to be $1\times10^{16}$ cm$^{-3}$ and the implantation depth was set to be 1 µm.

An ion implantation mask was formed from a silicon oxide film having an opening in a center of the p-type well region 2 and Al ions were implanted to thereby form the p-type contact region 3. The doping concentration was set to be $1\times10^{18}$ cm$^{-3}$. Simultaneously, a TLM (Transmission Line Model) pattern region to measure the contact resistivity of the p-type contact region 3 was formed near the device.

The n⁻-type silicon carbide substrate 1 was inserted into an annealing furnace to perform an activation process for five minutes at 1700 degrees C. in an Ar atmosphere. An ion implantation mask was formed from a silicon oxide film having an opening on the side of the p-type contact region 3 in the p-type well region 2 and phosphorus ions were implanted to thereby form the n-type source region 4 having a doping concentration of $1\times10^{19}$ cm$^{-3}$.

The n⁻-type silicon carbide substrate 1 was again inserted into the annealing furnace to perform an activation process for 5 minutes at 1700 degrees C. in an Ar atmosphere. The n⁻-type silicon carbide substrate 1 was inserted into a quartz tube to perform a thermal oxidation process at 1200 degrees C. in an atmosphere caused to contain water vapor by causing oxygen to flow through pure water, and a silicon oxide film to be the gate insulating film 5 was grown on the surface of the n⁻-type silicon carbide substrate 1 (the surface of the n⁻-type silicon carbide epitaxial layer). The thickness of the silicon oxide film was set to be 700 Å.

A polysilicon film having a thickness of 0.5 µm and having phosphorus doped therein was formed using a CVD method and the polysilicon film was patterned by photolithography to form the gate electrode 6. The gate electrode 6 was formed extending from an area that extends over the p-type well region 2 adjacent thereto to an area between the n⁻-type silicon carbide substrate 1 and the n-type source region 4 of the p-type well region 2.

A PSG (Phosphorus Silicon Glass) film having a thickness of 1 µm was disposed using the CVD method and the PSG film was patterned using photolithography to form the interlayer insulating film 7 in an area covering the gate electrode 6. The process steps of depositing the interlayer insulating film 7→patterning to form the openings of the interlayer insulating film 7→depositing the infrared ray absorbing film 8→patterning of the infrared ray absorbing film 8 were performs as described above.

A titanium nitride film, a molybdenum nitride film, a tungsten nitride film, a chromium nitride film, and a carbon film were disposed each having a thickness of 0.1 µm and as the infrared ray absorbing film 8. Sputtering was performed for each of the nitrides using an Ar gas and a sputtering target formed by firing a metal nitride. Sputtering was also performed for the carbon film using an Ar gas and the carbon target. Patterning was performed for each of the nitride films using chlorine and for the carbon film, using four hydrogen fluoride (4HF) as the etching gas, and the infrared ray absorbing film 8 was formed at positions excluding the source contact electrode portion 16, the gate contact electrode portion, and the TLM pattern region (exposed in the other opening of the interlayer insulting film 7 and not depicted).

An Al film having a thickness of 15 nm was formed using a sputtering method and the Al film was patterned to remain on the p-type contact region 3 and the TLM pattern region, to become the p-type contact pattern 9 and an Al electrode pattern for the TLM measurement, respectively. The Al electrode patterns for the TLM measurement were each shaped into a rectangle of 100×200 µm and were arranged having gaps of 1 µm, 2 µm, 4 µm, 8 µm, and 32 µm.

An Ni film of 60 nm was disposed using the sputtering method and the Ni film was patterned to remain on the source contact electrode portion 16 and the TLM pattern region, to become the Ni pattern 10 and the Ni electrode pattern for the TLM measurement, respectively. The Ni electrode pattern for the TLM measurement was set to be same as the Al electrode pattern for the TLM measurement. A Ni film was also disposed on the back side of the n⁻-type silicon carbide substrate 1 to have a thickness of 60 nm.

The n⁻-type silicon carbide substrate 1 was inserted into an RTA furnace, and silicide was formed using the Ni pattern 10 and the Ni electrode pattern for the TLM measurement by increasing the temperature to 1000 degrees C. at 4 degrees C. per second based on the measurement using a thermocouple installed on the carbon susceptor, in a nitrogen atmosphere and maintaining the temperature for 5 minutes to thereby form metal silicide films of Al and Ni.

An Al film having a film thickness of 5 µm was disposed using a sputtering method to form a source contact pad, a gate contact pad, and an electrode pad for TLM (the outlet electrode) 11.

A 100-nm Ti film and a 200-nm gold (Au) film, as a back-face electrode 12, were deposited on the back face of the n⁻-type silicon carbide substrate 1 using a thermal vapor deposition method.

A MOSFET device was produced according to the above process steps and measurement was conducted for the contact resistivity (the contact resistivity between the p-type contact region 3 and the p-type contact pattern 9) in the TLM pattern region. An average value was calculated from the measurements acquired in the wafer face, and a distribution of the contact resistivity was calculated using an equation, (the maximum value–the minimum value)/(the maximum value+the minimum value).

Comparative Example

FIG. 5 is a comparison diagram of a case where the infrared ray absorbing film is disposed according to the first embodiment of the present invention and a case where no such infrared ray absorbing film is disposed. As depicted in FIG. 5, the contact resistivity was measured in the TLM region for the MOSFET device having the infrared ray absorbing film 8 disposed therein of the first embodiment and a MOSFET device produced according to the process steps identical those of the first embodiment and not having the infrared ray absorbing film 8 disposed therein. As depicted in FIG. 5, it was confirmed that both the contact resistivity (the average value) and the contact resistivity distribution were reduced by disposing the infrared ray absorbing film 8 using each of the various materials, as compared to the case where the infrared ray absorbing film 8 was not disposed.

(Second Embodiment)

FIG. 6 is a comparison diagram of the contact resistivity between a case where the infrared ray absorbing film is disposed according to a second embodiment of the present invention and a case where the infrared ray absorbing film is not disposed. In the second embodiment, at the process steps identical to those of the first embodiment, titanium nitride films were disposed into the shapes (at the points) depicted in FIG. 2, FIG. 3, and FIG. 4, respectively as the infrared ray absorbing film 8. The dispersion of the contact resistivity of the p-type contact region 3 in the wafer face was measured using the TLM pattern region for measuring the contact resistivity near the device.

As depicted in FIG. 6, it was confirmed that both the contact resistivity (the average value) and the contact resistivity distribution were reduced by expanding the area of the infrared ray absorbing film 8 irrespective of the point (in FIGS. 2 to 4) where the infrared ray absorbing film 8 is disposed.

(Third Embodiment)

In a third embodiment, at the process steps identical to those of the first embodiment, a titanium nitride film to be the infrared ray absorbing film 8, was patterned into the shape depicted in FIG. 2 of the first embodiment, the n$^-$-type silicon carbide substrate 1 was again inserted into the dry etching apparatus to perform dry etching for 5 seconds using a chlorine gas, and the surface of the infrared ray absorbing film 8 was thereby roughened. Using this wafer, the dispersion of the contact resistivity of the p-type contact region 3 in the wafer face was measured.

As a result, it was confirmed that the average value of the contact resistivity was further improved from that of the first embodiment to be $0.03 \times 10^{-2}$ Cm$^3$.

(Fourth Embodiment)

In a fourth embodiment, at the process steps identical to those of the first embodiment, a titanium nitride film to be the infrared ray absorbing film 8, was patterned into the shape depicted in FIG. 2 of the first embodiment. In the RTA after the disposition of the Ni, samples were fabricated for which the heating rates were set to be 0.5 degrees C. per second, 1.0 degree C. per second, 4.0 degrees C. per second, and 10 degrees C. per second, and a cross-section of the source contact electrode portion 16 was cut off to check whether Ni silicide was formed.

Figure 7:
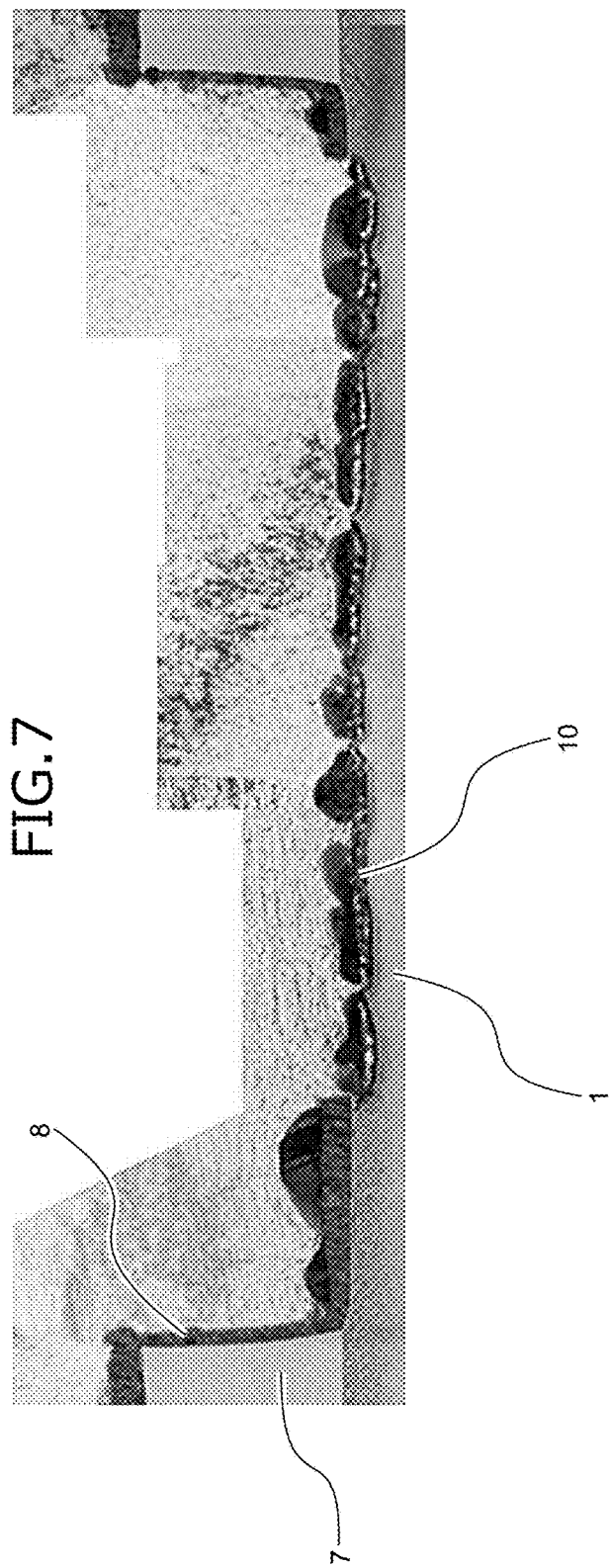
FIG. 7 is an image of a cross-section of the silicon carbide semiconductor device according to a fourth embodiment of the present invention (example of poor Ni silicide formation)
Figure 8:
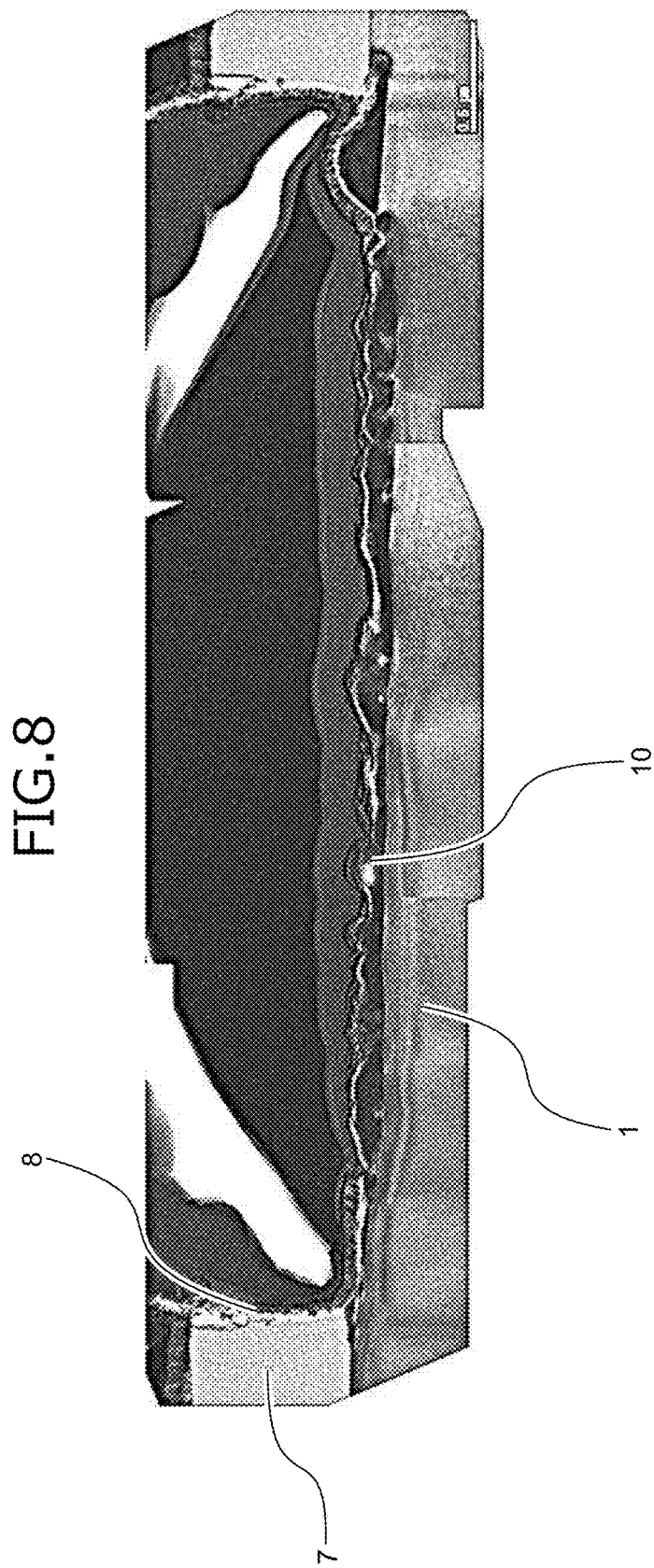
FIG. 8 is an image of a cross-section of the silicon carbide semiconductor device according to a fourth embodiment of the present invention (example of Ni silicide formation)

FIGS. 7 and 8 are images of cross-sections of the silicon carbide semiconductor device according to the fourth embodiment of the present invention. The silicon carbide semiconductor device depicted in FIG. 7 was produced with the heating rate of 0.5 degrees C. per second and that in FIG. 8 was produced with the heating rate of 4.0 degrees C. per second. In the case where the heating rate was low depicted in FIG. 7, a NiAl alloy was formed, divided into liquid-drop shapes on the n$^-$-type silicon carbide substrate 1 (reference numeral "10" in FIG. 7). Compositional chemical analysis revealed that substantially no Ni silicide was formed therein, confirming this to be an example of poor Ni silicide formation. On the other hand, in the case where the heating rate was 4 degrees C. per second as depicted in FIG. 8, it was confirmed that the Ni silicide was formed continuously in the entire source contact electrode portion 16 (reference numeral "10" in FIG. 8).

FIG. 9 is a table indicating presence/absence of Ni silicide formation according to heating rate, according to the fourth embodiment of the present invention. As depicted in FIG. 9, a heating rate of 1 degree C. per second or higher was necessary for the production of the Ni silicide.

According to each of the above embodiments, the metal silicide can be formed uniformly, dispersion of the contact resistivity can be prevented, and the properties and the reliability of the silicon carbide semiconductor device can be improved.

The present invention is not limited to the above embodiments and various changes can be made thereto within a scope that does not depart from the spirit of the present invention. For example, the present invention is further applicable when the p-type and the n-type are interchanged for each other or when the conductivity types of the silicon carbide substrate and the epitaxial layer grown on the principal surface of the silicon carbide substrate are set to be different from each other. In this case, a p-type contact pattern may be disposed to contact the p-type region to be the source region or the contact region, and a Ni pattern may be disposed to contact the n-type region to be the source region or the contact region.

INDUSTRIAL APPLICABILITY

As described, the semiconductor device according to the present invention is suitable for a vertical semiconductor apparatus in which electric current flows from the front face to the back face of the semiconductor substrate and is useful for, for example, a power semiconductor apparatus such as a power device and an industrial power semiconductor apparatus used for motor control or engine control.

According to the above configuration, metal silicide can be formed uniformly by using the infrared ray absorbing film and setting the heating rate in the RTA method to be a predetermined rate, and a higher performance silicon carbide semiconductor device can thereby be provided.

According to the present invention, metal silicide can formed uniformly, the difference in the contact resistivity between the n-type region and the p-type region can be made small, and long-term operating reliability can be obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method comprising:
    selectively forming an infrared ray absorbing film on a surface of a silicon carbide semiconductor substrate in a predetermined area, the infrared ray absorbing film being comprised of one of a multi-layered film of titanium nitride and titanium, a multi-layered film of molybdenum nitride and molybdenum, a multi-layered film of tungsten nitride and tungsten, or a multi-layered film of chromium nitride and chromium;
    sequentially forming on the silicon carbide semiconductor substrate an aluminum film and a nickel film in an area excluding the predetermined area in which the infrared ray absorbing film is formed; and
    uniformly forming an electrode by a rapid annealing process with a predetermined heating rate on the silicon carbide semiconductor substrate.

2. The method according to claim 1, wherein the rapid annealing process is performed by placing the silicon carbide semiconductor substrate on a carbon susceptor; and heating at an increasing temperature of at least 1 degree C. per second with respect to a temperature measurement of the carbon susceptor.

3. The method according to claim 1, further comprising roughening a surface of the infrared ray absorbing film.

4. A silicon carbide semiconductor device, comprising:
    a silicon carbide semiconductor substrate;
    an infrared ray absorbing film selectively formed on a surface of the silicon carbide semiconductor substrate in a predetermined area and being comprised of one of a multi-layered film of titanium nitride and titanium, a multi-layered film of molybdenum nitride and molybdenum, a multi-layered film of tungsten nitride and tungsten, or a multi-layered film of chromium nitride and chromium;

an aluminum film and a nickel film sequentially formed on the silicon carbide semiconductor substrate, in an area excluding the predetermined area in which the infrared ray absorbing film is formed; and an electrode uniformly formed on the silicon carbide semiconductor substrate, by a rapid annealing process at a predetermined heating rate.

5. The silicon carbide semiconductor device according to claim 4, wherein the infrared ray absorbing film is comprised of at least one of titanium nitride, molybdenum nitride, tungsten nitride, chromium nitride, and a multi-layered film thereof.

6. The silicon carbide semiconductor device according to claim 4, wherein the infrared ray absorbing film has a thickness ranging from 10 to 300 nm.

7. The silicon carbide semiconductor device according to claim 4, wherein the aluminum film has a thickness ranging from 10 to 100 nm.

8. The silicon carbide semiconductor device according to claim 4, wherein the nickel film is has a thickness ranging from 20 to 100 nm.

9. The silicon carbide semiconductor device according to claim 4, further comprising a chip area including an active region and a source contact electrode portion, and wherein the infrared ray absorbing film is formed in the active region excluding the source contact electrode portion of the chip area.

10. The silicon carbide semiconductor device according to claim 4, further comprising a chip area, and wherein the infrared ray absorbing film is formed in the chip area overall.

11. The silicon carbide semiconductor device according to claim 4, further comprising a wafer including a chip area, and wherein the infrared ray absorbing film is formed in an area excluding the chip area of the wafer.

12. The silicon carbide semiconductor device according to claim 4, further comprising an n-type region, a p-type region, and an interlayer insulating film having openings defined therein exposing the n-type region and the p-type region, respectively, and wherein the infrared ray absorbing film is formed in an area excluding the openings defined in the interlayer insulating film exposing the n-type region and a p-type region.

13. The silicon carbide semiconductor device according to claim 12, wherein the nickel film is formed on the n-type region, and the aluminum film and the nickel film are stacked on the p-type region.

\* \* \* \* \*